United States Patent [19]
Shieh et al.

[11] Patent Number: 5,274,655
[45] Date of Patent: Dec. 28, 1993

[54] TEMPERATURE INSENSITIVE VERTICAL CAVITY SURFACE EMITTING LASER

[75] Inventors: Chan-Long Shieh; Donald E. Ackley, both of Paradise Valley, Ariz.; Hsing-Chung Lee, Woodland Hills, Calif.

[73] Assignee: Motorola, Inc., Schaumburg, Ill.

[21] Appl. No.: 857,856

[22] Filed: Mar. 26, 1992

[51] Int. Cl.$^5$ .................................................. H01S 3/19
[52] U.S. Cl. .................................. 372/45; 372/46; 372/96
[58] Field of Search ........................... 372/45, 46, 96

[56] References Cited

U.S. PATENT DOCUMENTS

| | | | |
|---|---|---|---|
| 4,943,970 | 7/1990 | Bradley | 372/45 |
| 4,949,350 | 8/1990 | Jewell et al. | 372/45 |
| 5,034,958 | 7/1991 | Kwon et al. | 372/45 |
| 5,115,442 | 5/1992 | Lee et al. | 372/45 |

*Primary Examiner*—Georgia Y. Epps
*Attorney, Agent, or Firm*—Eugene A. Parsons

[57] ABSTRACT

A vertical cavity surface emitting laser with temperature insensitive threshold current is constructed with a peak gain at a predetermined wavelength and with a Fabry-Perot resonance at a wavelength higher than the predetermined wavelength of the peak gain. As operating temperatures rise the peak gain is reduced but the Fabry-Perot mode moves closer to the peak gain to maintain the current substantially constant.

5 Claims, 1 Drawing Sheet

LOW TEMPERATURE

HIGH TEMPERATURE

TEMPERATURE INSENSITIVE VERTICAL CAVITY SURFACE EMITTING LASER

The present invention pertains to vertical cavity surface emitting lasers and more specifically to vertical cavity surface emitting lasers which are substantially insensitive to ambient temperature changes.

BACKGROUND OF THE INVENTION

Generally, the threshold current of semiconductor lasers depends strongly on the ambient temperature, or the temperature of the laser. Usually, the threshold current increases with increasing ambient temperature. Therefore, in most optical communication systems the lasers are cooled by a thermolectric cooler. In some systems the laser driver is constructed with the capability to change the biasing point to compensate for any changes in the threshold current.

All of the countermeasures utilized to compensate for increasing threshold current with increasing ambient temperature greatly increase the cost of the optical system. In low cost optical interconnects it is preferable to have a direct drive laser without additional devices such as thermolectric coolers, etc. For such applications, the temperature sensitivity of the semiconductor laser is very important.

SUMMARY OF THE INVENTION

It is a purpose of the present invention to provide a laser which is substantially insensitive to ambient temperature changes.

It is a further purpose of the present invention to provide a surface emitting laser which is useful in many applications not previously possible, or practical, because it is small and inexpensive.

The above needs and purposes are achieved by a temperature insensitive vertical cavity surface emitting laser having a peak gain at a predetermined wavelength and constructed with a Fabry-Perot resonance at a wavelength longer than the predetermined wavelength of the peak gain.

The above needs and purposes are further achieved by a method of producing a temperature insensitive surface emitting laser including the steps of providing a substrate, depositing layers of material on the substrate to form a first mirror stack having a known thickness, an active layer positioned on the first mirror stack and having a known thickness and a second mirror stack positioned on the active layer and having a known thickness, the active layer being chosen and formed to provide a specific gain peak at a first specific wavelength for a known laser temperature, and adjusting the deposition to form the layers of material with a known thickness providing a Fabry-Perot resonance at a second specific wavelength, greater than the first specific wavelength of the specific gain peak, for the known laser temperature.

DESCRIPTION OF THE PREFERRED EMBODIMENT

Figure 1:
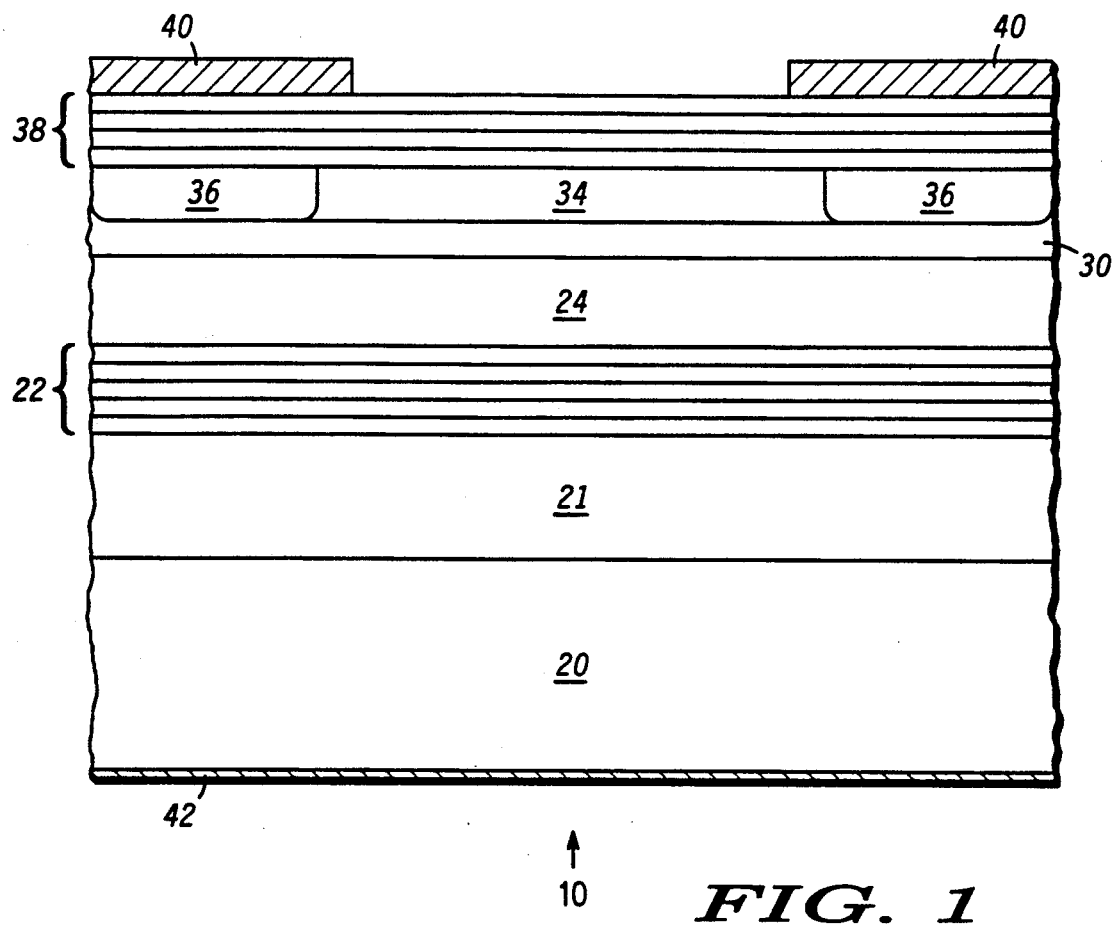
FIG. 1 is a cross-sectional view of a temperature insensitive surface emitting laser according to the present invention.

FIG. 1 illustrates a simplified enlarged crosssectional view of a surface emitting laser 10 in accordance with the present invention. A semiconductor substrate 20, which in this specific embodiment is fabricated of n type GaAs material, serves to provide an overall support for laser 10. The layers which comprise laser 10 are deposited or grown in ways well known in the art on the top surface of semiconductor substrate 20.

A buffer layer 21, typically 1000 Å of GaAs or AlGaAs, serves to smooth the top surface of semiconductor substrate 20. A lower reflector 22 is formed on top of buffer layer 21 which in turn is positioned above semiconductor substrate 20. Lower reflector 22 comprises a structure known as a distributed Bragg reflector in which a plurality of alternating layers of AlAs and AlGaAs, or AlGaAs with different Al compositions, are formed with matching crystal structures. Each layer comprising lower reflector 22 is formed having a thickness of approximately one quarter wavelength (0.25 Å) of the light output in the semiconductor material.

A bottom spacer 24, comprising approximately 1000 Å of AlGaAs is epitaxially grown on top of lower reflector 22. Bottom spacer 24 provides a region having a wide bandgap which serves to confine holes and electrons within an active layer 30. Active layer 30, positioned over bottom spacer 24, comprises a plurality of quantum wells, that is to say a plurality of light emitting regions, each approximately 100 Å thick. The plurality of light emitting regions are fabricated in a plane which is parallel to and above lower reflector 22 and is separated from lower reflector 22 by bottom spacer 24. The light emitting regions which comprise active layer 30 serve to emit light when a current is applied to them. Above active layer 30 is formed a top spacer 34. Top spacer 34 is similar in structure and function to bottom spacer 24. The total thickness of active layer 30, bottom spacer 24 and top spacer 34 equals a multiple of one half wavelength (0.5 Å) at the emission wavelength in the semiconductor to maintain a proper phase relationship between the mirrors.

A hydrogen implant 36 is typically implanted within portions of top spacer 34 to confine the current to the central region of laser 10. An output reflector 38 is formed above top spacer 34, in a plane above active layer 30. Output reflector 38 is typically similar in structure to lower reflector 22, except that the number of layers is fewer. Having fewer layers reduces the reflectivity of output reflector 38 and allows light to be preferentially emitted from the surface. The reflectivities of lower reflector 22 and output reflector 38 are selected such that light is emitted in the operating mode (Fabry-Perot mode) in a direction perpendicular to the upper surface of laser 10. It is, of course, well known in the art that surface emitting lasers, such as laser 10, have only one Fabry-Perot mode in the useful gain range of the laser and the lasing wavelength is decided by this Fabry-Perot mode.

A top contact 40 and a bottom contact 42, comprising a metal such as a gold alloy, are deposited on the top and bottom of the structure. Top contact 40 and bottom contact 41 serve as electrical contacts whereby a threshold current is applied to the laser 10 and thus to active layer 30. The threshold current is the amount of current required to produce lasing in laser 10 and, as stated above, increases with increases in ambient temperature.

The modal threshold gain for lasing in a surface emitter is given in an article entitled "InGaAs Vertical-Cavity Surface-Emitting Lasers", by R. S. Geels et al, IEEE J. Quantum Electron 27, 1359 (1991) which is incorporated herein by reference. The modal threshold gain may be approximated as:

$$g_{th} = \frac{L_{eff}}{\Gamma L_g} \beta_{fc} + \frac{1}{2\Gamma L_g} \ln\left(\frac{1}{R_f R_b}\right).$$

Where: $g_{th}$ is the lasing threshold gain, $\beta_{fc}$ is the nominal absorption loss (including free carrier losses), and the term $$\frac{1}{2\Gamma L_g} \ln\left(\frac{1}{R_f R_b}\right)$$

represents the end losses in the cavity. Since the gain medium does not fill the entire cavity, the length $L_g$ is the length of the gain medium, $L_{eff}$ is the penetration of the optical field into the mirrors, $\Gamma$ is the overlap of the optical field with the gain region, $R_f$ is the reflectivity of output reflector 12, and $R_b$ is the reflectivity of lower reflector 19.

Figure 2:
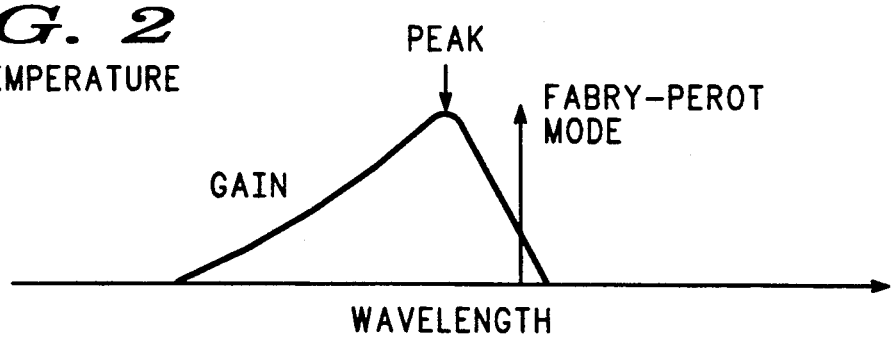
FIG. 2 is a graphical representation of the gain and Fabry-Perot resonance versus wavelength of the structure illustrated in FIG. 1 at a low temperature.
Figure 3:
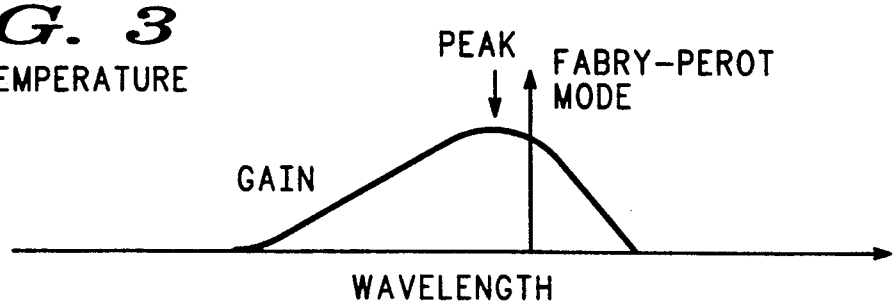
FIG. 3 is a graphical representation of the gain and Fabry-Perot resonance versus wavelength of the structure illustrated in FIG. 1 at a high temperature.

FIG. 2 is a graphical representation of the threshold gain and Fabry-Perot resonance versus wavelength of laser 10 (FIG. 1) at a low temperature, approximately 20 degrees Centigrade. FIG. 3 is a graphical representation of the threshold gain and Fabry-Perot resonance versus wavelength of laser 10 at a high temperature, approximately 70 degrees Centigrade. It should be noted that the threshold gain peaks at a specific wavelength for a specific temperature. That is, the wavelength of the peak gain for laser 10 with GaAs active layer 30 operating at 20 degrees Centigrade is approximately 8500 angstroms (850 nanometers).

Generally, as can be seen from the above equations, the gain is fixed by the characteristics of the active layer, i.e. well thickness and composition. In this specific embodiment, the lasing threshold gain ($g_{th}$) is selected by varying the thickness and composition of the gain region ($L_g$), typically by varying the thickness of the quantum wells in active layer 16. In other embodiments the lasing threshold gain ($g_{th}$) is selected by adjustment of the reflectivities of lower reflector 19 ($R_b$) and output reflector 12 ($R_f$), or combinations of the above. Further, the peak wavelength of the gain increases as the ambient temperature, or the operating temperature, increases, as illustrated by a comparison of FIGS. 2 and 3. Also, the overall peak gain of laser 10 decreases as the temperature increases due to the smearing of the Fermi-Dirac distribution and increasing nonradiative leakage. This effect can also be seen by a comparison of FIGS. 2 and 3.

The wavelength of the Fabry-Perot resonance is fixed by the construction of laser 10 and is most easily fixed by construction of reflectors 22 and 38. Since each layer of each reflector 22 and 38 is constructed a quarter of a wavelength thick to reflect light emitted from active area 30 in phase, the wavelength of the Fabry-Perot mode can be adjusted a small amount by selecting the operating wavelength and forming reflectors 22 and 38 by growing layers with a thickness of one quarter of the selected wavelength in the semiconductor. The Fabry-Perot resonance wavelength is also temperature dependent due to thermal expansion of the layers, but it has a different temperature dependence than the gain peak and the wavelength increases more slowly with changes in ambient temperature. This effect can also be seen from a comparison of FIGS. 2 and 3.

By constructing laser 10 with the Fabry-Perot mode toward the longer wavelength side of the gain peak, the temperature dependence of the threshold current is substantially reduced. As shown in FIG. 2, at low temperatures the Fabry-Perot mode has a longer wavelength than the gain peak. As the temperature rises, the wavelength of the gain peak increases faster than the wavelength of the Fabry-Perot mode and the distance between the two closes. As the distance between the gain peak and the Fabry-Perot mode closes, laser 10 operates higher on the curve of the gain peak, i.e. less threshold current is required. Also, as the temperature rises the amplitude of the gain peak is reduced (i.e., more threshold current is required) so that the combination of effects serves to maintain the overall operating threshold current substantially constant.

It should be understood that the top mirror stack (reflector 38 in FIG. 1) could be a stack of dielectric mirrors deposited by any of the well known methods, if convenient. Also, the active layer (layer 30 in FIG. 1) can be constructed of any of the well known materials, and temperature insensitivity is even more important for materials with smaller band gaps.

Thus, a laser is described and illustrated which may be used in applications having a wide range of ambient temperatures and no outside or additional temperature stabilization is required. Further, the described stabilization is incorporated into the manufacturing process and is, therefore, simple and inexpensive to achieve. Because no additional stabilization is required, the laser drive circuitry is substantially simplified and the laser package is much smaller. Also, because of the simplification and reduction in package size, the laser is useful in many applications not otherwise open to unstabilized lasers.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A temperature insensitive vertical cavity surface emitting laser having a peak gain at a predetermined wavelength and constructed with a Fabry-Perot resonance at a wavelength higher than the predetermined wavelength of the peak gain.

2. A temperature insensitive vertical cavity surface emitting laser as claimed in claim 1 wherein the laser includes an active layer and mirror stacks on either side thereof, the active layer and the mirror stacks are constructed to provide a selected wavelength of the Fabry-Perot resonance greater than the wavelength of the peak gain.

3. A temperature insensitive vertical cavity surface emitting laser comprising:

an active layer having two major sides and a known thickness between the two sides;

a mirror stack formed on each major side and each stack having a known thickness;

the active layer and mirror stacks cooperating to provide a specific gain peak at a first specific wavelength for a known laser temperature, the wavelength of the gain peak increasing at a predetermined rate as the laser temperature increases; and the active layer and the mirror stacks having a known thickness providing a Fabry-Perot resonance at a second specific wavelength, greater than the first specific wavelength of the specific gain peak, for the known laser temperature.

4. A temperature insensitive vertical cavity surface emitting laser as claimed in claim 3 wherein the wavelength of the Fabry-Perot resonance increases at a second predetermined rate as the laser temperature increases, and the second specific wavelength is an amount greater than the first specific wavelength such that threshold current of the laser remains substantially constant.

5. A method of producing a temperature insensitive vertical cavity surface emitting laser comprising the steps of:

providing a substrate;

depositing layers of material on the substrate to form a first mirror stack having a known thickness, an active layer positioned on the first mirror stack and having a known thickness and a second mirror stack positioned on the active layer and having a known thickness, the active layer being chosen and formed to provide a specific gain peak at a first specific wavelength for a known laser temperature; and adjusting the deposition to form the layers of material with a known thickness providing a Fabry-Perot resonance at a second specific wavelength, greater than the first specific wavelength of the specific gain peak, for the known laser temperature.

* * * * *